US006252969B1

(12) United States Patent
Ando

(10) Patent No.: US 6,252,969 B1
(45) Date of Patent: Jun. 26, 2001

(54) HOWLING DETECTION AND PREVENTION CIRCUIT AND A LOUDSPEAKER SYSTEM EMPLOYING THE SAME

(75) Inventor: Shigeo Ando, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 08/968,248

(22) Filed: Nov. 12, 1997

(30) Foreign Application Priority Data

Nov. 13, 1996 (JP) .................................................. 8-302194

(51) Int. Cl.[7] ........................................................ H03G 5/00

(52) U.S. Cl. ................................ 381/103; 381/83; 381/93

(58) Field of Search ................................ 381/93, 83, 103, 381/104, 107, 108

(56) References Cited

U.S. PATENT DOCUMENTS 4,783,819 11/1988 De Koning et al. .
5,442,712 * 8/1995 Kawamura et al. .................... 381/93
5,677,987 * 10/1997 Seki et al. .............................. 381/83

FOREIGN PATENT DOCUMENTS 161995 9/1984 (JP) .
60-126998 7/1985 (JP) .
60-176313 9/1985 (JP) .

OTHER PUBLICATIONS

J. Boudy, et al., "Hands–free Radiotelephones for car applications", publication date Dec. 1, 1992, pp. 247–253.

* cited by examiner

*Primary Examiner*—Minsun Oh Harvey
(74) *Attorney, Agent, or Firm*—Pillsbury Winthrop LLP

(57) ABSTRACT

A howling detection and prevention circuit which receives an output of a microphone as its input signal and detects howling therein includes a computing section which divides frequency of the input signal into a plurality of frequency bands on the basis of a predetermined sampling period and computes power of each of the frequency bands, an identifying section which sequentially shifts the frequency band and identifies whether howling exists or not in accordance with a predetermined condition by employing a value of the computed power of each frequency band, and a gain adjusting section which, when howling has been detected as a result of the identifying, adjusts gain of the frequency band in which the howling has been detected to prevent the howling. A loudspeaker system employing this howling detection and prevention circuit is also provided.

7 Claims, 4 Drawing Sheets

HOWLING DETECTION AND PREVENTION CIRCUIT AND A LOUDSPEAKER SYSTEM EMPLOYING THE SAME

BACKGROUND OF THE INVENTION

This invention relates to a howling detection and prevention circuit and a loudspeaker system employing this circuit.

In radiating an acoustic power using a microphone and a loudspeaker, a loud sound produced by the loudspeker is sometimes accompanied by howling. For preventing howling, it is conceivable to increase entire gain of radiation of an acoustic power in which howling is produced by restraining the entire gain of radiation of acoustic power to a level which is below a level at which howling is produced or reduce the gain of a frequency region in which howling starts to take place. In the past, for preventing howling, a user manipulates a volume control while confirming presence or absence of howling to set the entire gain of radiation of acoustic power to a level at which howling is not produced or sets the entire gain after decreasing the gain of a particular frequency region by using a graphic equalizer or a notch filter. Adjustment of the gain is made relying upon the user's hearing. Once howling has occurred, the user usually hurries to the loudspeaker system and stops howling by lowering the volume level. In such a case, it takes time before howling stops and the user cannot avoid unpleasantness caused by howling during this time.

Thus, manual adjustment of the gain for preventing occurrence of howling in the prior art loudspeaker system has caused the problems of lack in accuracy and stability, requirement for the troublesome adjustment and requirement for time for adjustment.

It is, therefore, an object of the invention to provide a howling detection and prevention circuit capable of automatically detecting and preventing howling and a loudspeaker system employing the same circuit.

SUMMARY OF THE INVENTION

For achieving the above described object of the invention, there is provided a howling detection and prevention circuit which receives an output of a microphone as its input signal and detects howling therein comprising a computing section which divides frequency of the input signal into a plurality of frequency bands on the basis of a predetermined sampling period and computes power of each of the frequency bands, an identifying section which sequentially shifts the frequency band and identifies whether howling exists or not in accordance with a predetermined condition by employing value of the computed power of each frequency band, and a gain adjusting section which, when howling has been detected as a result of the identifying, adjusts gain of the frequency band in which the howling has been detected to prevent the howling.

According to the invention, an input signal is divided into frequency bands and thereafter power of each frequency band is computed. The condition of howling is searched by sequentially changing the frequency band and, when there is a frequency band which satisfies the howling condition, this band is detected as a howling frequency band and prevention of howling is performed. By this arrangement, in a loudspeaker system and a PA (public address) system using a microphone, howling which occurs when sound volume is raised above a certain value can be automatically detected. When howling has been detected, the howling can be prevented by automatically adjusting gain of the frequency band. Accordingly, howling can be automatically prevented without requiring a user's manipulation.

In one aspect of the invention, the howling detection and prevention circuit further comprises an entire gain adjusting section which adjusts entire gain of all of the frequency bands in accordance with the result of the identifying by the identifying section to prevent the howling.

In another aspect of the invention, said computing section computes power of each frequency band by computing moving averages with respect to each of the frequency bands which has been provided by frequency division on the basis of the predetermined sampling period.

In another aspect of the invention, said identifying section identifies presence or absence of howling on the basis difference between an absolute value of a power in the frequency band under identifying and a power of the frequency band in the vicinity thereof.

In still another aspect of the invention, there is provided a loudspeaker system comprising a microphone, a howling detection and prevention circuit described above which receives a signal from the microphone as its input signal, an amplifying section which amplifies an output signal of the howling detection and prevention circuit, and a loudspeaker which is driven by an output of the amplifying section.

A preferred embodiment of the invention will be described below with reference to the accompanying drawings.

BRIEF DESCRIPTION OF THE DRAWINGS

In the accompanying drawings.

DESCRIPTION OF A PREFERRED EMBODIMENT

Figure 1:
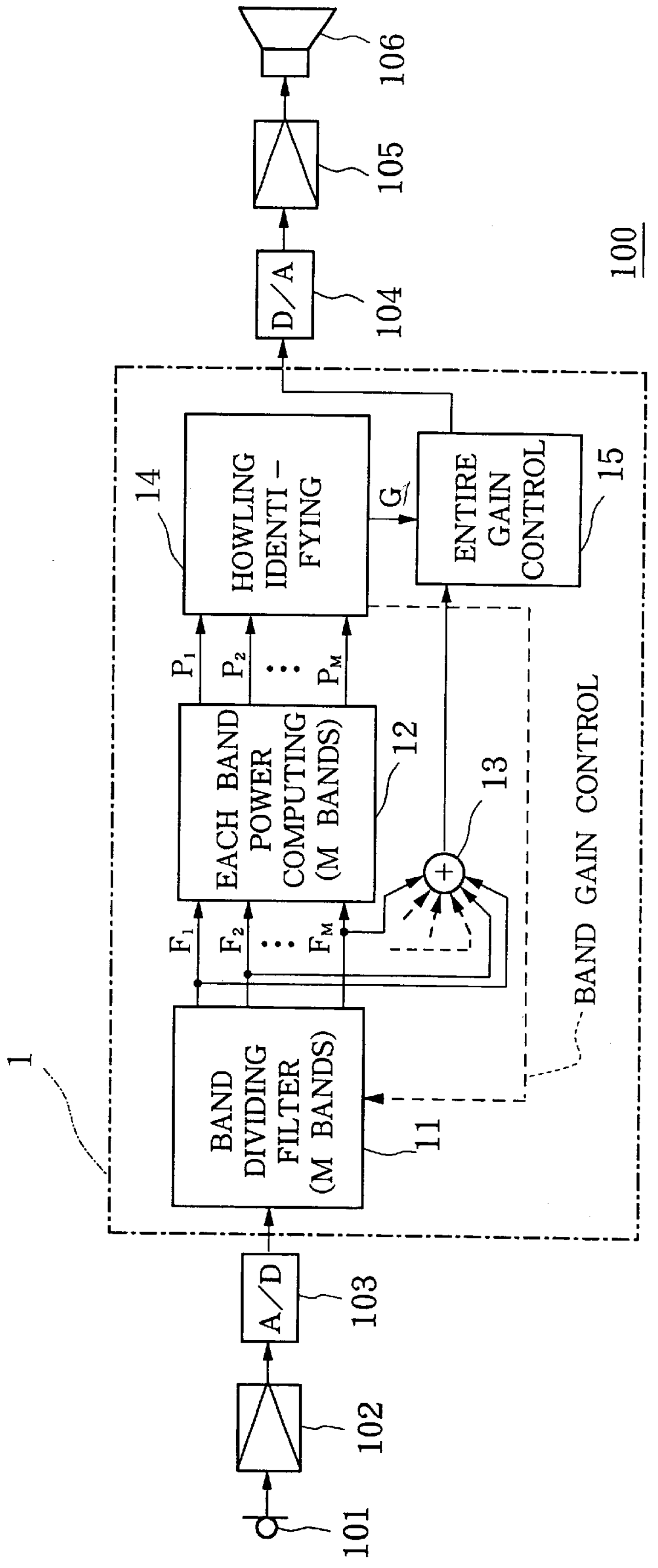
FIG. 1 is a block diagram showing an embodiment of a howling detection and prevention circuit and a loudspeaker system according to the invention.

FIG. 1 shows an embodiment of a howling detection and prevention circuit according to the invention and a loudspeaker system incorporating this circuit.

A loudspeaker system 100 includes a microphone 101, a microphone amplifier 102 which amplifies an output signal of the microphone 101, an analog-to-digital converter 103 which converts the analog output signal of the microphone amplifier 102 to a digital signal, a howling detection and prevention circuit 1 which receives the digital output of the analog-to-digital converter 103 as an input signal, processes this input signal and supplies the result of processing to a digital-to-analog converter 104, a power amplifier 105 which amplifies the output signal of the digital-to-analog converter 104 in accordance with a gain which has been set at a desired value by an operator, and a loudspeaker 106 which is driven by the output signal of the power amplifier 105. The howling detection and prevention circuit 1 includes various circuits such as a microcomputer, a signal processing chip, a memory and a timer. In FIG. 1, the internal structure of the circuit 1 is illustrated by blocks representing respective functions of the circuit 1.

A digital signal provided from the analog-to-digital converter 103 is applied to a band dividing filter section 11 of the howling detection and prevention circuit 1. The band dividing filter section 11 consists of M (an integer including 2 and over) FIR (finite impulse response) bandpass filters or IIR (infinite impulse response) bandpass filters whose center frequencies are sequentially shifted. The band dividing filter section 11 divides the input signal from the analog-to-digital converter 103 into signals of M frequency bands and, after imparting a predetermined gain to these signals, supplies these signals as signals F1, F2, . . . FM to both an each band power computing section 12 and an adding section 13. The each band power computing section 12 computes power values P1, P2, . . . PM of the signals F1, F2, . . . FM of the respective bands and supplies these power values P1, P2, . . . PM to a howling identifying section 14. The adding section 13 adds the signals Fl, F2, . . . FM of the M bands together to obtain the signal of the entire bands and supplies the result of the addition to an entire gain control section 15. The howling identifying section 14 identifies the state of occurrence of howling on the basis the power values P1, P2, . . . PM of the signals in the respective bands and establishes, on the basis of the result of the identifying, a gain of each band which is used in the band dividing filter section 11 and also establishes a gain G for the signal of the entire bands which is used in the entire gain control section 15. The entire gain control section 15 multiplies the sum signal of the entire bands with the gain G and supplies the result of the computation to the digital-to-analog converter 104. By this arrangement, the howling detection and prevention circuit 1 reduces, on the basis of the result of the identifying as to howling, a gain of a band in which howling has occurred or is likely to occur and thereby prevents occurrence of howling. In a case where howling remains unstopped despite the set gain for the band has been reduced, the howling can be stopped by reducing the entire gain G. By this arrangement, howling can be completely prevented even when an excessive gain has been set by the user.

Figure 2:
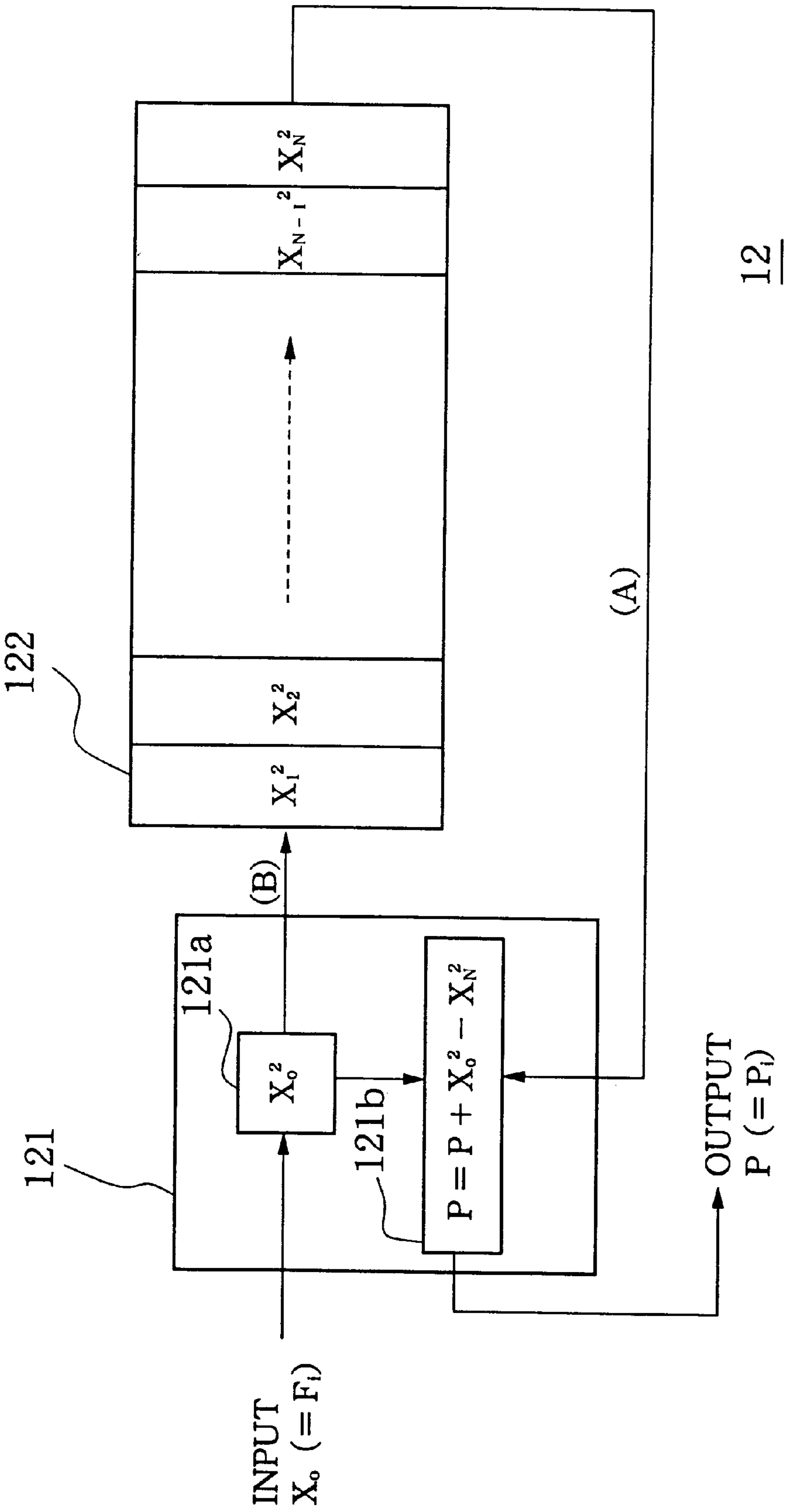
FIG. 2 is a block diagram showing the internal structure of an each band power computing section 12 of FIG. 1.

Referring now to FIG. 2, an example of internal structure of the each band power computing section 12 shown in FIG. 1 will be described. The circuit block shown in FIG. 2 is a structure for computing a power of one frequency band in the each band power computing section 12 and the each band power computing section 12 has M blocks of the same construction. Each block for one band of the each band power computing section 12 includes an operation circuit 121 consisting of a squarer 121*a* and an adder-subtractor 121*b*, and an N-tap shift memory 122 having N taps. It is now assumed that an input signal XO (a signal corresponding to any of the signal Fi (i=1, 2, . . . M) of FIG. 1) has been supplied with a predetermined sampling period k (k being a desired integer). In this case, the squarer 121*a* computes square value $X\mathbf{0}^2$ of the input signal X0 and supplies the result $X\mathbf{0}^2$ to the adder-subtractor 121*b* and to each input terminal of the N-tap shift memory 122. The adder-subtractor 121*b* adds a computed value P obtained in the preceding sampling period k−1 and the square value $X\mathbf{0}^2$ provided by the squarer 121*a* together and subtracts from the sum of this addition a value $XN^2$(A) of the last stage of the N-tap shift memory 122 before shifting the memory (i.e., the output of the N-th tap) thereby to obtain a new computed value P. Then, the N-tap shift memory 122 sequentially shifts stored values of N memories and stores, as a value $X1^2$ (B), result of computation $X\mathbf{0}^2$ of the squarer 121*a* in the current sampling period k. Upon repeating the above operation N times, the result P of the computation becomes $P=(XN^2+XN-1^2+ \ldots +X1^2)+X0^2-XN^2=XN-1^2+ \ldots +X1^2+X0^2$ which is an accumulated value of square values of the input signals in the past N samples including the square value $N\mathbf{0}^2$ of the input signal N0 at the current sampling period. As a result, the signal P (a signal corresponding to any of the signal Pi (i=1, 2, . . . M) in FIG. 1) which is supplied from the adder-subtractor 121*b* to the howling identifying circuit 14 corresponds to an accumulated value of instantaneous power of the N input signals X0. Therefore, by multiplying this signal P with a predetermined constant (e.g., a value corresponding to a reciprocal of the sampling number N), a value corresponding to moving averages for N samples of the instantaneous power of the input signal X0 can be obtained.

Figure 3:
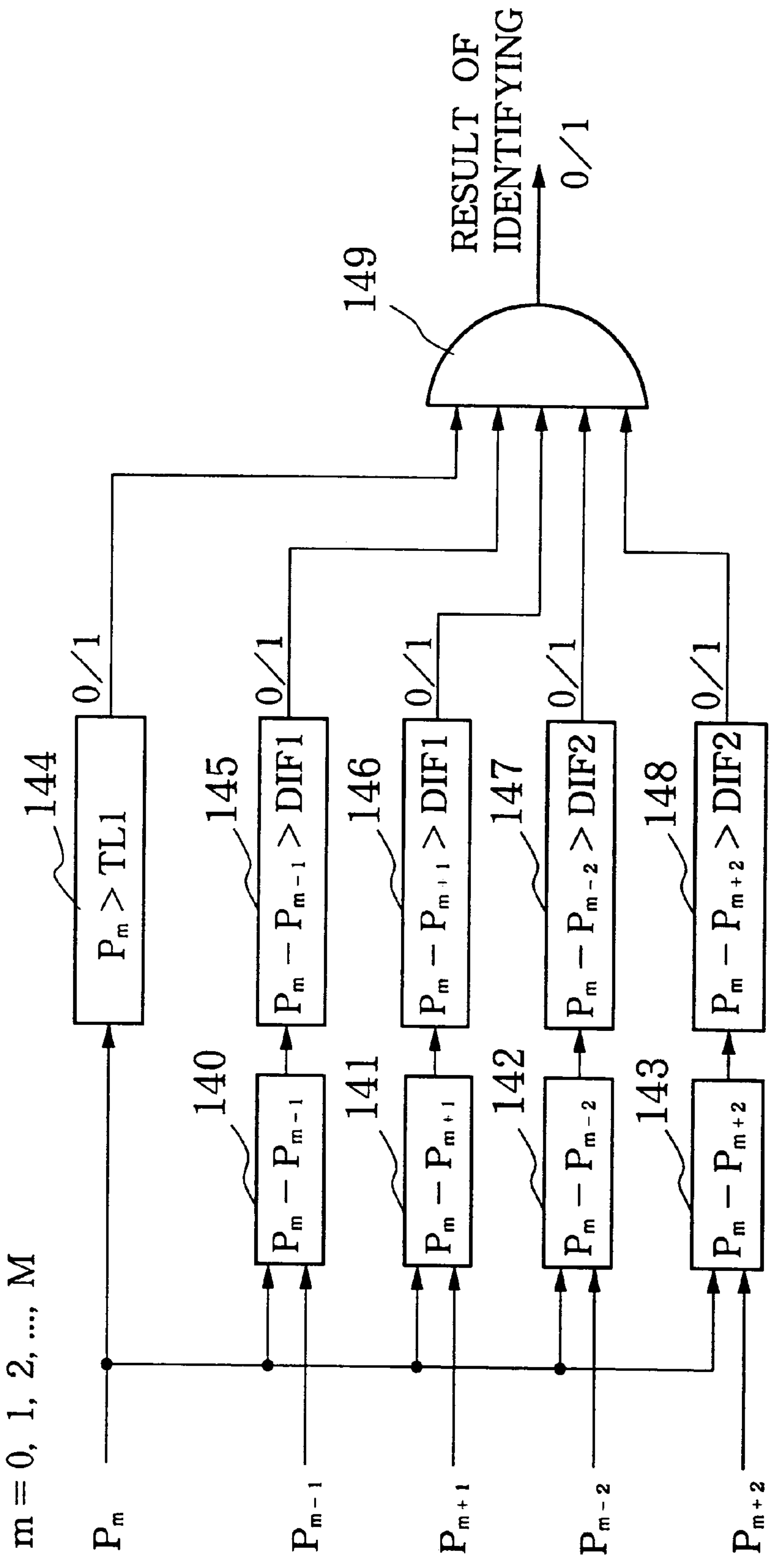
FIG. 3 is a block diagram showing the internal structure of a howling identifying section 14 of FIG. 1.
Figure 4:
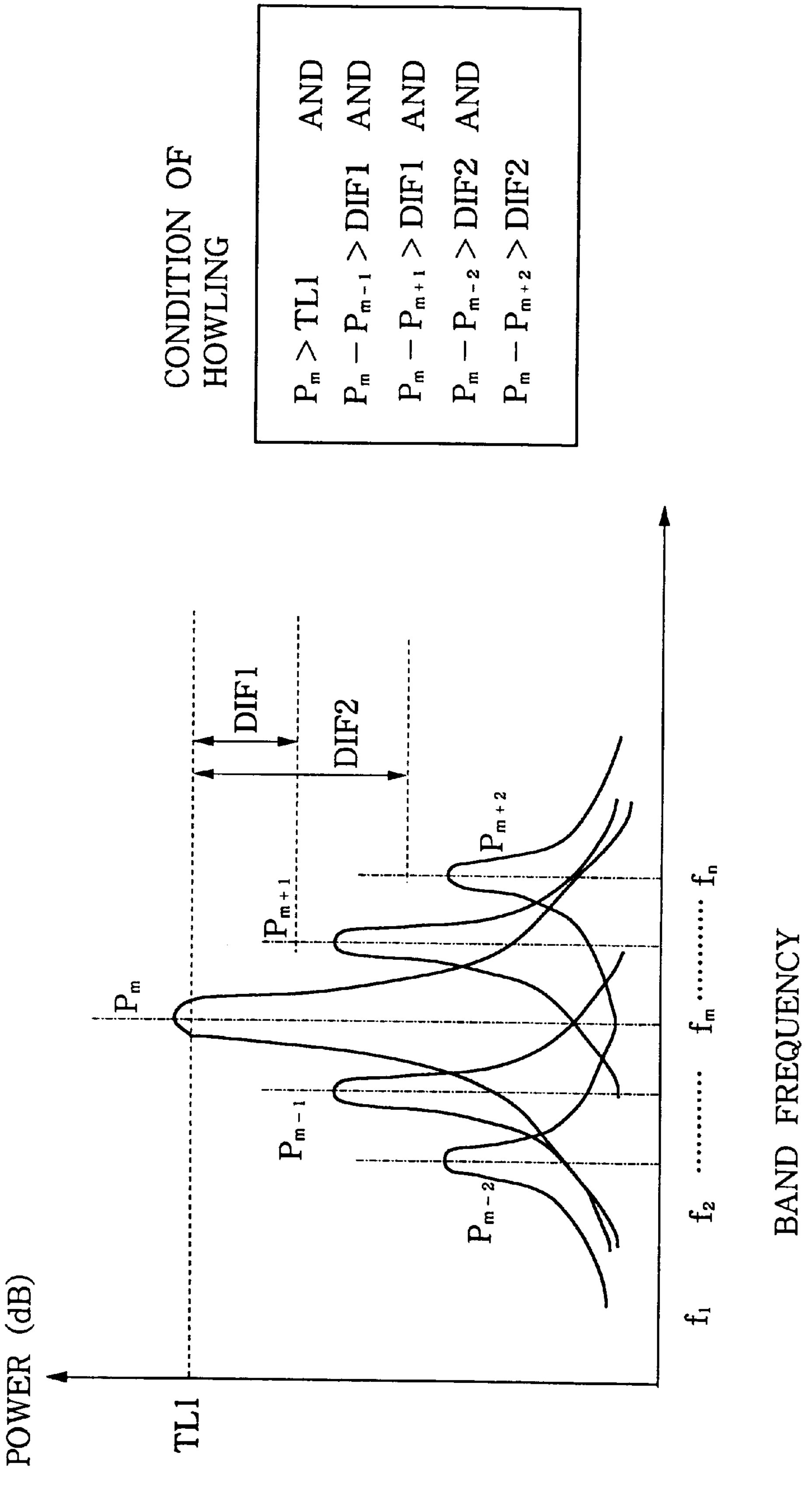
FIG. 4 is a schematic diagram for describing the condition for identifying howling in the howling identifying section 14.

Referring now to FIGS. 3 and 4, an example of the internal structure of the howling identifying section 14 shown in FIG. 1 will be described. FIG. 3 is a diagram showing a circuit block in the howling identifying section 14 for identifying whether howling has occurred or not or howling is likely to occur or not. The howling identifying section 14 has, in addition to this circuit block, a circuit for selecting an input signal and a circuit for setting gains used in the band dividing filter section 11 and the entire gain control section 15 on the basis of the result of the identifying. In FIG. 3, input signals Pm, Pm−1, Pm+1, Pm−2 and Pm+2 represent five signals consisting of a power signal Pm of a desired band in the power values P1, P2, . . . PM of FIG. 1 and power signals Pm−1, Pm+1, Pm−2 and Pm+2 which are power signals of two adjacent bands on both sides of the power signal Pm. The suffix m is a value which is sequentially shifted from 0 to M. In case of m=0, 1 and m=M−1, M, identifying is made on the basis of data on one side only on which data of a corresponding suffix exists. When the signals Pm, Pm−1, Pm+1, Pm−2 and Pm+2 have been applied, subtraction circuits 140, 141, 142 and 143 perform computation of Pm−Pm−1, Pm−Pm+1, Pm−Pm−2 and Pm−Pm+2 respectively and output results of the computation. Then, comparison circuits 144, 145, 146, 147 and 148 perform comparison as to whether or not conditions Pm>TL1, Pm−Pm−1>D1F1, Pm−Pm+1>D1F1, Pm−Pm−2>D1F2 and Pm−Pm+2>D1F2 exist and output a result of comparison "0" (the condition is not satisfied) or "1" (the condition is satisfied). TL1, D1F1 and D1F2 are reference values which are used for the comparison and set in conformity with actual conditions of use of the loudspeaker system. An AND circuit 149 seeks a logical sum of results of comparison of all comparison circuits 144 to 148 and, when all of the conditions of comparison have been satisfied, outputs a signal "1" which represents the result of identifying that howling has occurred or is likely to occur.

FIG. 4 is a diagram which schematically shows an example of relation between the comparison reference values TL1, D1F1 and D1F2 and the input signals Pm, Pm−1, Pm−2, Pm+1 and Pm+2. The example of FIG. 4 is illustrated on the assumption that the power signal Pm of the center frequency band has satisfied the above condition of identifying and therefore a howling states exists. A signal of a frequency band in which howling has occurred or howling is likely to occur has a larger power than signals of frequency bands in the vicinity thereof and this relation is as illustrated in FIG. 4. Whether the signal which has satisfied the condition, i.e., the power signal Pm of the center frequency band, has a peak with respect to signals of frequency bands in the vicinity thereof or not can be detected by detecting whether the power signal Pm of the center frequency band has a power which has difference of D1F1 or D1F2 or over with respect to the upper and lower two frequency bands. The reference values D1F1 and D1F2 are normally set so that D1F1 becomes larger than D1F2. However, even when difference between the power signal Pm of the center frequency band and the signals of frequency bands in the vicinity is larger than D1F1 and D1F2, howling does not occur in case the absolute value of the power signal Pm is relatively small. This condition can be judged by comparing the power signal Pm with the reference value TL1, i.e., using not only identifying of difference value but also identifying of the absolute value. In the present embodiment, therefore, both identifying of the absolute value, i.e., as to whether the power signal Pm is larger than the reference value TL1 or not and identifying of the difference value, i.e., as to whether the power signal Pm is larger than the reference values D1F1 and F1F2 or not are made and, when both conditions are satisfied, it is judged that frequency band of the power signal Pm is in a howling state.

By the above described structure, the howling identifying section 14 shifts the center frequency sequentially and performs judgment as to whether there is a frequency band which satisfies the howling condition and determines a band which satisfies the howling condition as the howling frequency band. In the case of M=9, 1 and m=M−1, M, existing data of one side only is used and identifying is made by making Pm−1=Pm+1 or Pm−2=Pm+2. For reducing the gain of the frequency band which has been determined as the howling frequency band, the gain of the corresponding frequency band in the band dividing filter 11 is reduced. In this case, howling can be prevented by reducing the gain by about the reference value D1F1 used in the identifying of the difference value. In a case where the howling condition has been satisfied in a plurality of bands, gains of all of the bands which have satisfied the howling condition are reduced. In a case where the howling state has been detected even when the gain of the band filter which has satisfied the howling condition has been reduced, the howling identifying section 14 reduces the value of the gain used in the entire gain control section 15. By this operation, occurrence of howling which cannot be prevented by reducing the gain of the divided frequency band can be completely prevented.

As described in the foregoing, by computing power of a certain time section for each frequency band on the basis of moving averages for each sampling period and making identifying of howling by using this power, an adverse effect of timewise change of the signal waveform on the result of identifying can be avoided and a stable identifying of howling can be achieved. Further, according to the above described embodiment, identifying of howling can be made in real time and gain of each frequency band or entire gain can be adjusted automatically, so that prevention of howling which relied mainly upon the user's operation can be automatically performed.

What is claimed is:

1. A howling detection and prevention circuit which receives an output of a microphone as an input signal and detects howling therein comprising:

- a computing section which divides the input signal into a plurality of frequency bands on the basis of a predetermined sampling period and computes a power of each one of the frequency bands;
- an identifying section which sequentially analyzes each one of the plurality of frequency bands and identifies whether howling exists in accordance with a predetermined condition based on a value of the computed power of each one of the frequency bands; and
- a gain adjusting section which, when howling has been detected by the identifying section, adjusts a gain of the frequency band in which the howling has been detected to prevent the howling.

2. A howling detection and prevention circuit as defined in claim 1 further comprising an entire gain adjusting section which adjusts an entire gain of all of the frequency bands in accordance with result from the identifying section to prevent the howling when the adjusting of the frequency band by the gain adjusting section does not prevent the howling.

3. A howling detection and prevention circuit as defined in claim 1 wherein said computing section computes power of each frequency band by computing moving averages with respect to each of the frequency bands which has been provided by frequency division on the basis of the predetermined sampling period.

4. A howling detection and prevention circuit as defined in claim 1 wherein said identifying section identifies presence or absence of howling on the basis difference between an absolute value of a power in the frequency band under the judgment and a power of the frequency band in the vicinity thereof.

5. A loudspeaker system comprising:

- a microphone;
- a howling detection and prevention circuit which receives an output of the microphone as an input signal and detects howling therein, said howling detection and prevention circuit including
  - a computing section which divides the input signal into a plurality of frequency bands on the basis of a predetermined sampling period and computes a power of each one of the frequency bands,
  - an identifying section which sequentially analyzes each one of the plurality of frequency bands and identifies whether howling exists in accordance with a predetermined condition based on a value of the computed power of each one of the frequency bands, and
  - a gain adjusting section which, when howling has been detected by the identifying section, adjusts a gain of the frequency band in which the howling has been detected to prevent the howling;
- an amplifying section which amplifies an output signal of the howling detection and prevention circuit; and
- a loudspeaker which is driven by an output of the amplifying section.

6. A howling detection and prevention circuit as defined in claim 1, wherein the gain adjusting section is adapted to adjust the gain of the frequency band in which the howling has been detected and adjust an entire gain of the input signal to prevent the howling.

7. Howling detection and prevention circuit which receives an output of a microphone as an input signal and detects howling therein comprising:

- a computing section which divides the input signal into a plurality of frequency bands on the basis of a predetermined sampling period and computes a power of each one of the frequency bands, wherein the computing section computes the power of each one of the frequency bands by computing moving averages with respect to each one of the frequency bands that has been provided by division of the input signal on the basis of the predetermined sampling period;
- an identifying section which sequentially analyzes each one of the plurality of frequency bands and identifies whether howling exists in accordance with a predetermined condition based on a value of the computed power of each one of the frequency bands; and
- a gain adjusting section which, when howling has been detected by the identifying section, adjusts a gain of the frequency band in which the howling has been detected to prevent the howling.

* * * * *